United States Patent
Nishihara et al.

(10) Patent No.: US 10,483,411 B2
(45) Date of Patent: Nov. 19, 2019

(54) SOLAR CELL AND SOLAR CELL MODULE

(71) Applicant: Panasonic Corporation, Osaka (JP)

(72) Inventors: Takashi Nishihara, Osaka (JP); Shinya Fujimura, Osaka (JP); Takayuki Negami, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 16/000,921

(22) Filed: Jun. 6, 2018

(65) Prior Publication Data

US 2019/0006537 A1   Jan. 3, 2019

(30) Foreign Application Priority Data

Jun. 30, 2017   (JP) .................. 2017-128544

(51) Int. Cl.
| | |
|---|---|
| H01L 27/30 | (2006.01) |
| H01L 31/0224 | (2006.01) |
| H01L 31/042 | (2014.01) |
| H01L 31/0264 | (2006.01) |
| H01L 51/44 | (2006.01) |

(52) U.S. Cl.
CPC .... *H01L 31/022425* (2013.01); *H01L 27/301* (2013.01); *H01L 31/0264* (2013.01); *H01L 31/042* (2013.01); *H01L 51/441* (2013.01)

(58) Field of Classification Search
CPC ..................................... H01L 27/301
USPC .................................. 136/243–265
See application file for complete search history.

(56) References Cited

U.S. PATENT DOCUMENTS

| | | | |
|---|---|---|---|
| 2015/0311364 A1* | 10/2015 | Wu | .............. H01L 51/0003 438/82 |
| 2016/0276612 A1 | 9/2016 | Gotanda | |
| 2018/0374655 A1* | 12/2018 | Jin | .............. H01L 31/02 |

FOREIGN PATENT DOCUMENTS

| | | |
|---|---|---|
| JP | 2010-267534 | 11/2010 |
| JP | 2016-178156 | 10/2016 |

OTHER PUBLICATIONS

Park et al., Organic solar cells fabricated by one-step deposition of a bulk heterojunction mixture and TiO2/NiO hole collecting agents, 2012, ACS Publications, The Journal of Physical Chemistry C, pp. 15348-15352 (Year: 2012).*

Amor et al., Structural, optical and electrical studies on Mg-doped NiO thin films for sensitivity applications, Materials Science in Semiconductor Processing, 2014, vol. 27, pp. 994-1006 (Year: 2014).*

(Continued)

*Primary Examiner* — Eli S Mekhlin
*Assistant Examiner* — Dujuan A Horton
(74) *Attorney, Agent, or Firm* — McDermott Will & Emery LLP

(57) ABSTRACT

A solar cell includes: a first electrode; a first hole transport layer containing nickel; an inorganic material layer containing titanium; a light-absorbing layer converting light into electric charge; and a second electrode. The first electrode, the first hole transport layer, the inorganic material layer, the light-absorbing layer, and the second electrode are layered in that order. The light-absorbing layer contains a perovskite compound represented by a formula AMX3, where A is a monovalent cation, M is a divalent cation, and X is a monovalent anion.

20 Claims, 10 Drawing Sheets

(56) References Cited

OTHER PUBLICATIONS

Qiu et al. Enhanced physical properties of pulsed laser deposited NiO films via annealing and lithium doping for improving perovskite solar cells, Mar. 2017, Journal of Materials Chemistry C, pp. 7084-7094 (Year: 2017).*

Wei Chen et al., "Efficient and stable large-area perovskite solar cells with inorganic charge extraction layers", Science, vol. 350 Issue6263, Nov. 20, 2015, pp. 944-948.

Nam Joong Jeon et al., "Solvent engineering for high-performance inorganic-organic hybrid perovskite solar cells", Nature Materials, vol. 13, Jul. 6, 2014, pp. 897-903.

Jeong-Hyeok Im et al., "Growth of CH3NH3PbI3 cuboids with controlled size for high-efficiency perovskite solar cells", Nature Nanotechnology, vol. 9, Aug. 31, 2014, pp. 927-932.

Julian Burschka et al., "Sequential deposition as a route to high-performance perovskite-sensitized solar cells", Nature, vol. 499, Jul. 10, 2013, pp. 316-320.

\* cited by examiner

SOLAR CELL AND SOLAR CELL MODULE

BACKGROUND

1. Technical Field

The present disclosure relates to solar cells and solar cell modules. The present disclosure particularly relates to a solar cell and a solar cell module, in which a perovskite-type crystal is used as a light-absorbing material.

2. Description of the Related Art

In recent years, solar cells in which a compound (hereinafter referred to as "perovskite compound") having a perovskite crystal structure represented by a formula $AMX_3$ or a similar crystal structure is used as a light-absorbing material have been researched and developed. Herein, a solar cell containing the perovskite compound is referred to as "perovskite solar cell".

Wei Chen et al., *Science* (United States), vol. 350, no. 6263 (November 2015), pp. 944-948 (hereinafter referred to as the "non-patent document") discloses a perovskite solar cell in which $CH_3NH_3PbI_3$ is used as a perovskite material, nickel oxide doped with lithium and magnesium is used as a hole transport material, and [6,6]-phenyl-C61-butyric acid methyl ester (PCBM) is used as an electron transport material and which has an inverted stack structure.

SUMMARY

One non-limiting and exemplary embodiment provides a solar cell capable of having high photoelectric conversion efficiency.

In one general aspect, the techniques disclosed here feature a solar cell including a first electrode; a first hole transport layer containing nickel; an inorganic material layer containing titanium; a light-absorbing layer converting light into electric charge; and a second electrode, wherein the first electrode, the first hole transport layer, the inorganic material layer, the light-absorbing layer, and the second electrode are layered in that order, and the light-absorbing layer contains a perovskite compound represented by a formula $AMX_3$, where A is a monovalent cation, M is a divalent cation, and X is a monovalent anion.

It should be noted that general or specific embodiments may be implemented as an element, a device, a module, a system, an integrated circuit, or a method. It should be noted that general or specific embodiments may be implemented as any selective combination of an element, a device, a module, a system, an integrated circuit, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
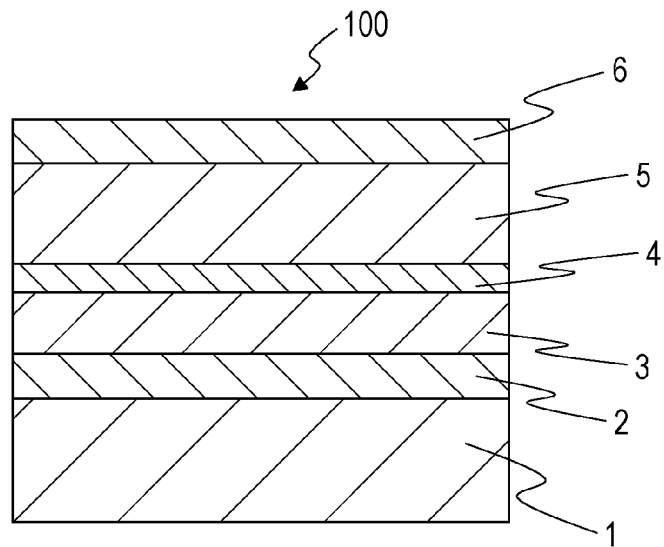
FIG. 1 is a schematic sectional view of a solar cell according to a first embodiment of the present disclosure.

Underlying knowledge forming the basis of the present disclosure is as described below.

Perovskite solar cells (hereinafter simply referred to as "solar cells") are classified into a regular stack structure and an inverted stack structure. In the regular stack structure, an electron transport layer is placed on the light-incident side of a light-absorbing layer (hereinafter referred to as the "perovskite layer") containing a perovskite compound. For example, the electron transport layer, the perovskite layer, a hole transport layer, and an upper electrode (for example, a metal electrode) are placed on a transparent electrode in that order. In the inverted stack structure, a hole transport layer is placed on the light-incident side of a perovskite layer. For example, the hole transport layer, the perovskite layer, an electron transport layer, and an upper electrode are placed on a transparent electrode in that order.

In the regular stack structure, since the hole transport layer is formed after the formation of the perovskite layer, an organic material formable by a low-temperature process is usually used as a material (hole transport material) for the hole transport layer. In contrast, in the inverted stack structure, since the hole transport layer is formed before the formation of the perovskite layer, the hole transport layer can be formed at relatively high temperature and an inorganic material can be used as a hole transport material. For example, the non-patent document discloses that nickel oxide is used as a hole transport material.

The inventors have carried out investigations and have found that a conventional solar cell with an inverted stack structure tends to have a short-circuit current density ($J_{sc}$) lower than that of a solar cell with a regular stack structure. The reason for this is probably as described below.

In the conventional solar cell with the inverted stack structure, a perovskite layer is formed on an NiO layer serving as a hole transport layer. Since a perovskite solution has low wettability to the NiO layer, it is difficult to form a perovskite compound in which the density of defects such as pinholes is low on the NiO layer. When the defect density of a perovskite compound is high, the recombination of carriers in the perovskite layer may possibly increase. As a result, the short-circuit current density ($J_{sc}$) is low, leading to a reduction in photoelectric conversion efficiency. In the regular stack structure, the perovskite layer is formed on, for example, a titanium oxide ($TiO_2$) layer serving as an electron transport layer. Since the wettability of the perovskite solution to the TiO$_2$ layer is higher than the wettability to the NiO layer, a perovskite layer with low defect density can be formed on the TiO$_2$ layer. Accordingly, the above-mentioned problem does not occur.

The inventors have carried out investigations on the basis of the above finding and, as a result, have found a novel structure that is capable of suppressing the recombination of carriers in a light-absorbing layer by reducing the defect density of a perovskite layer in a solar cell with an inverted stack structure.

The present disclosure includes a solar cell and solar cell module specified in items below.

Item 1

A solar cell includes
a first electrode;
a first hole transport layer containing nickel;
an inorganic material layer containing titanium;
a light-absorbing layer converting light into electric charge; and
a second electrode, wherein
the first electrode, the first hole transport layer, the inorganic material layer,
the light-absorbing layer, and the second electrode are layered in that order, and
the light-absorbing layer contains a perovskite compound represented by a formula AMX$_3$, where A is a monovalent cation, M is a divalent cation, and X is a monovalent anion.

Item 2

In the solar cell specified in Item 1, the first hole transport layer may further contain magnesium.

Item 3

In the solar cell specified in Item 1 or 2, the first hole transport layer may further contain lithium.

Item 4

The solar cell specified in Item 3 may further include a second hole transport layer, located between the first hole transport layer and the inorganic material layer, containing nickel and lithium.

An atomic ratio of lithium to all metal elements in the second hole transport layer may be less than an atomic ratio of lithium to all metal elements in the first hole transport layer.

Item 5

The solar cell specified in Item 3 may further include a second hole transport layer, located between the first hole transport layer and the inorganic material layer, containing nickel and substantially no lithium.

Item 6

In the solar cell specified in any one of Items 1 to 5, an atomic ratio of lithium to all the metal elements in the first hole transport layer may be 1% or more and 30% or less.

Item 7

In the solar cell specified in Item 6, the atomic ratio of lithium to all the metal elements in the first hole transport layer may be 5% or more and 20% or less.

Item 8

In the solar cell specified in any one of Items 1 to 7, a thickness of the inorganic material layer may be less than a thickness of the first hole transport layer.

Item 9

In the solar cell specified in any one of Items 1 to 8, the inorganic material layer may have a thickness of 1 nm or more and 20 nm or less.

Item 10

In the solar cell specified in Item 9, the inorganic material layer may have a thickness of 3 nm or more and 10 nm or less.

Item 11

A solar cell module includes
a substrate; and
first and second unit cells that are located on the substrate and that are connected in series to each other, each of the first and second unit cells including:
a first electrode;
a first hole transport layer containing nickel;
an inorganic material layer containing titanium;
a light-absorbing layer converting light into electric charge; and
a second electrode, wherein
the first electrode, the first hole transport layer, the inorganic material layer, the light-absorbing layer, and the second electrode are layered on the substrate in that order,
the light-absorbing layer contains a perovskite compound represented by a formula AMX$_3$, where A is a monovalent cation, M is a divalent cation, and X is a monovalent anion,
the first electrode, the first hole transport layer, and the inorganic material layer of the first unit cell are separated from the first electrode, the first hole transport layer, and the inorganic material layer of the second unit cell by a trench, and
the light-absorbing layer of the first unit cell is in contact with the first hole transport layer of the first unit cell and the first hole transport layer of the second unit cell in the trench.

Item 12

In the solar cell module specified in Item 11, the first hole transport layer may further contain magnesium.

Item 13

In the solar cell module specified in Item 11 or 12, the first hole transport layer may further contain lithium.

Item 14

In the solar cell module specified in Item 13, each of the first and second unit cells may further include a second hole transport layer, located between the first hole transport layer and the inorganic material layer, containing nickel and lithium and
an atomic ratio of lithium to all metal elements in the second hole transport layer may be less than an atomic ratio of lithium to all metal elements in the first hole transport layer.

Item 15

In the solar cell module specified in Item 13, each of the first and second unit cells may further include a second hole transport layer, located between the first hole transport layer and the inorganic material layer, containing nickel and substantially no lithium.

Item 16

In the solar cell module specified in any one of Items 11 to 15, an atomic ratio of lithium to all the metal elements in the first hole transport layer may be 1% or more and 30% or less.

Item 17

In the solar cell module specified in Item 16, the atomic ratio of lithium to all the metal elements in the first hole transport layer may be 5% or more and 20% or less.

Item 18

In the solar cell module specified in any one of Items 11 to 17, a thickness of the inorganic material layer may be less than a thickness of the first hole transport layer.

Item 19

In the solar cell module specified in any one of Items 11 to 18, the inorganic material layer may have a thickness of 1 nm or more and 20 nm or less.

Item 20

In the solar cell module specified in Item 19, the inorganic material layer may have a thickness of 3 nm or more and 10 nm or less.

Embodiments of the present disclosure are described below with reference to the accompanying drawings.

First Embodiment

FIG. 1 is a schematic sectional view of a solar cell 100 according to a first embodiment of the present disclosure.

As shown in FIG. 1, the solar cell 100 includes a substrate 1, a first electrode 2, a first hole transport layer 3, an inorganic material layer 4, a light-absorbing layer 5, and a second electrode 6.

The first electrode 2 is light-transmissive and therefore light enters the solar cell 100 from the substrate 1 side. The first hole transport layer 3 is placed on the light-incident side of the light-absorbing layer 5. Thus, the solar cell 100 has an inverted stack structure.

The first hole transport layer 3 contains nickel.

The inorganic material layer 4 is located on the first hole transport layer 3 and contains titanium.

The light-absorbing layer 5 converts light into electric charge. The light-absorbing layer 5 is placed on the inorganic material layer 4 so as to be in contact with the inorganic material layer 4. The light-absorbing layer 5 contains a perovskite compound represented by the formula $AMX_3$, where A is a monovalent cation, M is a divalent cation, and X is a monovalent anion.

Fundamental effects of the solar cell 100 are described below.

When the solar cell 100 is irradiated with light, the light-absorbing layer 5 absorbs light to generate excited electrons and holes. The excited electrons migrate to the second electrode 6. On the other hand, the holes generated in the light-absorbing layer 5 migrate to the first hole transport layer 3 through the inorganic material layer 4. Since the first hole transport layer 3 is connected to the first electrode 2, a current can be extracted from the solar cell 100 in such a manner that the first electrode 2 is used as a positive electrode and the second electrode 6 is used as a negative electrode.

In this embodiment, since the inorganic material layer 4 is placed between the first hole transport layer 3 and the light-absorbing layer 5, the light-absorbing layer 5 can be formed using the inorganic material layer 4 as a base layer. Thus, the wettability of a material solution for the light-absorbing layer 5 to a base layer and the surface morphology of the base layer can be appropriately set. This enables the crystallinity of the perovskite compound in the light-absorbing layer 5 to be increased as compared to the case where the light-absorbing layer 5 is formed using the first hole transport layer 3 as a base layer. As a result, the recombination of carriers in the light-absorbing layer 5 can be suppressed and therefore the photoelectric conversion efficiency of the solar cell 100 can be increased.

Components of the solar cell 100 are described below.

Substrate 1

The substrate 1 is an auxiliary component of the solar cell 100. The substrate 1 physically supports stacked layers of the solar cell 100 in the form of a film when the solar cell 100 is configured. The substrate 1 is light-transmissive. The substrate 1 used may be, for example, a glass substrate, a plastic substrate (including a plastic film), or the like. In the case where the first electrode 2 can support the layers in the form of a film, the substrate 1 may be omitted.

First Electrode 2

The first electrode 2 is electrically conductive. Furthermore, the first electrode 2 is light-transmissive. The first electrode 2 transmits, for example, visible light and near-infrared light. The first electrode 2 can be formed using a material such as a transparent, electrically conductive metal oxide. Examples of the transparent, electrically conductive metal oxide include an indium-tin composite oxide; tin oxide doped with antimony; tin oxide doped with fluorine; zinc oxide doped with boron, aluminium, gallium, or indium; and composites of these compounds. The first electrode 2 may be formed using an opaque material so as to have a light-transmissive pattern.

Examples of the light-transmissive pattern include a linear (striped) pattern, a wavy pattern, a grid (mesh) pattern, a punching metal-like pattern having a large number of fine through-holes arranged regularly or irregularly, and patterns obtained by positively or negatively inverting these patterns. When the first electrode 2 has the light-transmissive pattern, light can pass through a portion in which the opaque material is not present. Examples of the opaque material include platinum, gold, silver, copper, aluminium, rhodium, indium, titanium, iron, nickel, tin, zinc, and alloys containing either of these metals. Alternatively, an electrically conductive carbon material can be used.

The light transmittance of the first electrode 2 is, for example, 50% or more or may be 80% or more. The wavelength of light that should be transmitted depends on the absorption wavelength of the light-absorbing layer 5. The thickness of the first electrode 2 is within the range of, for example, 1 nm to 1,000 nm.

Light-Absorbing Layer 5

The light-absorbing layer 5 contains the perovskite compound, which is represented by the formula $AMX_3$. The perovskite compound serves as a light-absorbing material. In the formula $AMX_3$, A is the monovalent cation. Examples of the monovalent cation include monovalent cations such as alkali metal cations and organic cations. Particular examples of the monovalent cation include a methylammonium cation ($CH_3NH_3^+$), a formamidinium cation ($NH_2CHNH_2^+$), a cesium cation ($Cs^+$), and a rubidium cation ($Rb^+$).

In the formula $AMX_3$, M is the divalent cation. Examples of the divalent cation include divalent cations of transition metals and group 13 to 15 elements. Particular examples of the divalent cation include $Pb^{2+}$, $Ge^{2+}$, and $Sn^{2+}$. In the formula $AMX_3$, X is the monovalent anion. The monovalent anion is a halogen anion or the like.

The site of each of A, M, and X may be occupied by multiple types of ions. Examples of the perovskite compound include $CH_3NH_3PbI_3$, $CH_3CH_2NH_3PbI_3$, $NH_2CHNH_2PbI_3$, $CH_3NH_3PbBr_3$, $CH_3NH_3PbCl_3$, $CsPbI_3$, $CsPbBr_3$, $RbPbI_3$, and $RbPbBr_3$.

The thickness of the light-absorbing layer 5 depends on the magnitude of the light absorption thereof and is, for example, 100 nm to 1,000 nm. The light-absorbing layer 5 can be formed by a coating process using a solution, a co-deposition process, or the like. The light-absorbing layer 5 may be partly mixed with an electron transport layer.

First Hole Transport Layer 3

The first hole transport layer 3 contains a semiconductor. The first hole transport layer 3 may be made of an inorganic p-type semiconductor. Examples of the inorganic p-type semiconductor include nickel oxide and materials obtained by substituting a portion of nickel in nickel oxide with another element. Examples of the other element include lithium and magnesium.

The first hole transport layer 3 may further contain lithium. The atomic ratio of lithium to all metal elements in the first hole transport layer 3 may be 1% to 30% or 5% to 20%. The first hole transport layer 3 may be made of a material obtained by substituting a portion of nickel in nickel oxide with lithium. Substituting a portion of nickel in nickel oxide with lithium enables the density of carriers to be increased and therefore enables the electrical conductivity to be increased. The amount of lithium substituting for nickel (the substitution amount of lithium) is represented by, for example, the atomic ratio of lithium to all the metal elements in the first hole transport layer 3 and may be 1% to 30% or 5% to 20%. Setting the substitution amount of lithium within the above range enables the increase in electrical conductivity of the first hole transport layer 3 and the ensuring of the light transmissivity thereof to be both achieved.

The first hole transport layer 3 may further contain magnesium. The atomic ratio of magnesium to all the metal elements in the first hole transport layer 3 may be 1% to 30% or 5% to 20%. The first hole transport layer 3 may be made of a material obtained by substituting a portion of nickel in nickel oxide with magnesium. Substituting a portion of nickel in nickel oxide with magnesium enables the light transmissivity of the first hole transport layer 3 to be increased and also enables the level of the valence band to be lowered, thereby enabling the hole transportability to be increased. The amount (substitution amount) of magnesium substituting for nickel is represented by, for example, the atomic ratio of magnesium to all the metal elements in the first hole transport layer 3 and may be 1% to 30% or 5% to 20%. Setting the substitution amount of magnesium within the above range enables the crystallinity of the first hole transport layer 3 to be maintained high and also enables the light transmissivity and hole transportability of the first hole transport layer 3 to be increased.

The first hole transport layer 3 may contain both lithium and magnesium. The sum of the atomic ratio of lithium to all the metal elements in the first hole transport layer 3 and that of magnesium may be 1% to 30% or 5% to 20%. A portion of nickel in nickel oxide may be substituted with lithium and another portion thereof may be substituted with magnesium. In this case, the sum of the substitution amount of lithium and that of magnesium may be, for example, 1% to 30% or 5% to 20%.

In a regular stack structure, an organic material formable by a low-temperature process is usually used in a hole transport layer as described above. In the regular stack structure, if a metal element such as Li or Mg is added to the organic material, which makes up the hole transport layer, Li or the like may possibly be diffused in a light-absorbing layer by an increase in temperature to reduce the reliability of a solar cell. However, in the inverted stack structure, since the first hole transport layer 3 is formed before the light-absorbing layer 5 is formed, the first hole transport layer 3 can be formed at a relatively high temperature and an inorganic material can be used to form the first hole transport layer 3. Even if a metal element, such as Li or Mg, serving as a substitution element is added to the inorganic material used to form the first hole transport layer 3, Li or the like is unlikely to be diffused in the light-absorbing layer 5. This is because, in the inverted stack structure, the first hole transport layer 3 is formed at a relatively high temperature and therefore an added element such as Li or Mg is placed at the lattice position of an original metal element by substitution. Thus, the reliability of a solar cell can be ensured and the hole transportability can be improved.

The thickness of the first hole transport layer 3 may be 1 nm to 50 nm or 5 nm to 20 nm. Setting the thickness of the first hole transport layer 3 within such a range enables the resistance of the first hole transport layer 3 to be kept low and also enables the hole transportability of the first hole transport layer 3 to be sufficiently exhibited.

A coating process or a printing process can be used to form the first hole transport layer 3. Examples of the coating process include a doctor blade process, a bar-coating process, a spraying process, a dip coating process, and a spin coating process. An example of the printing process is a screen printing process. The first hole transport layer 3 may be prepared using a mixture of multiple materials, followed by pressing or firing as required. When the first hole transport layer 3 is made of a low-molecular-weight organic substance or an inorganic semiconductor, the first hole transport layer 3 can be prepared by a vacuum vapor deposition process or a sputtering process.

Inorganic Material Layer 4

The inorganic material layer 4 serves as a base (base layer) when the light-absorbing layer 5 is formed. The inorganic material layer 4 may contain a material that has high wettability to the material solution for the light-absorbing layer 5 (that is highly hydrophilic). In this embodiment, the inorganic material layer 4 mainly contains titanium (Ti). In particular, the inorganic material layer 4 preferably contains titanium oxide, which is an inorganic n-type semiconductor material. The inorganic material layer 4 may contain, for example, an oxide of a metal element such as Al, In, Ga, Cr, Mo, W, Zr, Hf, Nb, Ta, or Zn in addition to titanium.

The inorganic material layer 4 may be thinner than, for example, the first hole transport layer 3. When the inorganic material layer 4 is thinner than the first hole transport layer 3, the wettability of the material solution for the light-absorbing layer 5 to the surface of a base can be increased without inhibiting the transport of holes from the light-absorbing layer 5 to the first hole transport layer 3. Therefore, the crystallinity of the light-absorbing layer 5 can be increased.

The thickness of the inorganic material layer 4 may be 1 nm to 20 nm or 3 nm to 10 nm. Setting the thickness of the inorganic material layer 4 to 20 nm or less enables the effect of an increase in photoelectric conversion efficiency to be obtained without inhibiting the transport of holes from the light-absorbing layer 5 to the first hole transport layer 3.

Second Electrode 6

The second electrode 6 is electrically conductive. The second electrode 6 need not be light-transmissive. The second electrode 6 is placed so as to face the first electrode 2 with the light-absorbing layer 5 therebetween. That is, the second electrode 6 is placed opposite to the first electrode 2 with respect to the light-absorbing layer 5.

The second electrode 6 forms no ohmic contact with the light-absorbing layer 5. The second electrode 6 has the property of blocking holes from the light-absorbing layer 5. The property of blocking holes from the light-absorbing layer 5 is the property of transmitting only electrons generated in the light-absorbing layer 5 without transmitting holes. A material having such a property is a material with a Fermi level lower than the energy level of the valence band minimum of the light-absorbing layer 5. A particular example of such a material is aluminium.

Second Embodiment

A solar cell 200 according to a second embodiment of the present disclosure is different from the solar cell 100 according to the first embodiment in that the solar cell 200 includes a second hole transport layer 7.

The solar cell 200 is described below. Components having substantially the same function and configuration as those used to describe the solar cell 100 are given the same reference numerals and will not be described in detail.

Figure 2:
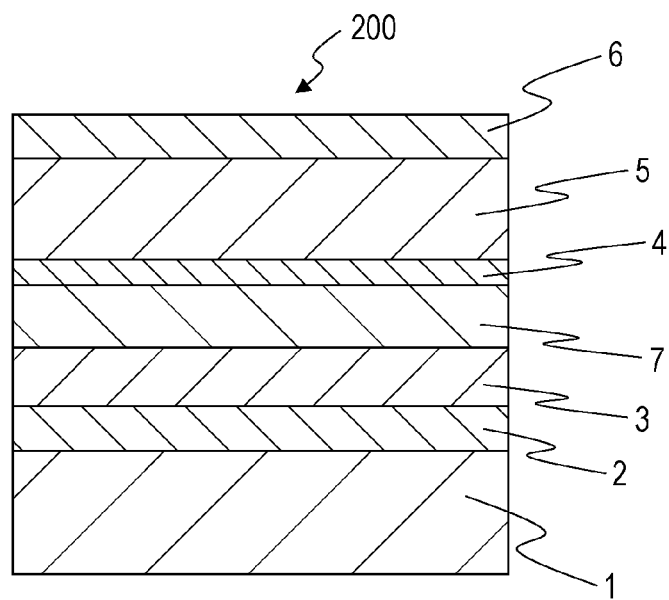
FIG. 2 is a schematic sectional view of a solar cell according to a second embodiment of the present disclosure.

As shown in FIG. 2, the solar cell 200 includes a substrate 1, a first electrode 2, a first hole transport layer 3, an inorganic material layer 4, a light-absorbing layer 5, and a second electrode 6 in addition to the second hole transport layer 7.

The second hole transport layer 7 is placed between the first hole transport layer 3 and the inorganic material layer 4.

The first hole transport layer 3 and the second hole transport layer 7 may contain nickel and lithium. In this case, the atomic ratio of lithium to all metal elements in the second hole transport layer 7 (for example, the substitution amount of lithium) may be less than the atomic ratio of lithium to all metal elements in the first hole transport layer 3. For example, a material obtained by substituting a portion of nickel in nickel oxide with lithium can be used as a material for the first hole transport layer 3 and the second hole transport layer 7. In this case, the substitution amount of lithium in the second hole transport layer 7 may be less than the substitution amount of lithium in the first hole transport layer 3.

Alternatively, the first hole transport layer 3 may contain nickel and lithium and the second hole transport layer 7 may contain nickel and substantially no lithium. The expression "contain substantially no lithium" means that something is formed without intentionally adding lithium. The expression "contain substantially no lithium" also means that the content of lithium is, for example, less than 0.05% by weight. The first hole transport layer 3 may be made of, for example, a material obtained by substituting a portion of nickel in nickel oxide with lithium and the second hole transport layer 7 may be made of, for example, nickel oxide substituted with no lithium.

Fundamental action effects of the solar cell 200 are described below.

When the solar cell 200 is irradiated with light, the light-absorbing layer 5 absorbs light to generate excited electrons and holes. The excited electrons migrate to the second electrode 6. On the other hand, the holes generated in the light-absorbing layer 5 migrate to the first hole transport layer 3 through the inorganic material layer 4 and the second hole transport layer 7 in that order. Since the first hole transport layer 3 is connected to the first electrode 2, a current can be drawn from the solar cell 200 in such a manner that the first electrode 2 is used as a positive electrode and the second electrode 6 is used as a negative electrode.

In this embodiment, the second hole transport layer 7 is placed between the first hole transport layer 3 and the inorganic material layer 4. The second hole transport layer 7 is made of, for example, a material in which the atomic ratio of lithium to all metal elements is less than that in the first hole transport layer 3. The amount of lithium doped in the second hole transport layer 7 may be less than that in the first hole transport layer 3. This enables, for example, the level of the valence band of the second hole transport layer 7 to be set between the level of the valence band of the first hole transport layer 3 and the level of the valence band of the light-absorbing layer 5. Thus, holes can be readily moved from the light-absorbing layer 5 to the first electrode 2.

The second hole transport layer 7 may be made of the same material as that for the first hole transport layer 3. The first hole transport layer 3 and the second hole transport layer 7 may be made of, for example, nickel oxide or a material obtained by substituting a portion of nickel in nickel oxide with lithium. The substitution amount of lithium in the second hole transport layer 7 may be less than the substitution amount of lithium in the first hole transport layer 3. This allows the number of carrier recombination centers present in the second hole transport layer 7 to be less than that in the first hole transport layer 3. Placing the second hole transport layer 7 on the light-absorbing layer 5 side of the first hole transport layer 3 enables the possibility that the holes generated in the light-absorbing layer 5 are lost by recombination to be reduced.

The sum of the atomic ratio of lithium to all metal elements in the second hole transport layer 7 and that of magnesium may be, for example, 0% to 15% or 0% to 10%.

The thickness of the second hole transport layer 7 may be 1 nm to 10 nm or 2 nm to 5 nm. Setting the thickness of the second hole transport layer 7 within such a range allows the resistance of the second hole transport layer 7 to be small and enables the hole transportability thereof to be sufficiently exhibited.

A hole transport layer in this embodiment is not limited to a two-layer structure including the first hole transport layer 3 and the second hole transport layer 7. The hole transport layer may have, for example, a multilayer structure composed of three or more layers including the first hole transport layer 3 and the second hole transport layer 7. Alternatively, the hole transport layer need not have any multilayer structure. The hole transport layer may be, for example, a layer in which the proportion of lithium (the atomic ratio of lithium to all metal elements) decreases stepwise or continuously from the substrate 1 side toward the light-absorbing layer 5 side. The hole transport layer can be formed by, for example, a known process such as a spraying process, a spin coating process, or a sputtering process.

Third Embodiment

A solar cell 300 according to a third embodiment of the present disclosure is different from the solar cell 100 according to the first embodiment in that the solar cell 300 includes an electron transport layer 8.

The solar cell 300 is described below. Components having substantially the same function and configuration as those used to describe the solar cell 100 are given the same reference numerals and will not be described in detail.

Figure 3:
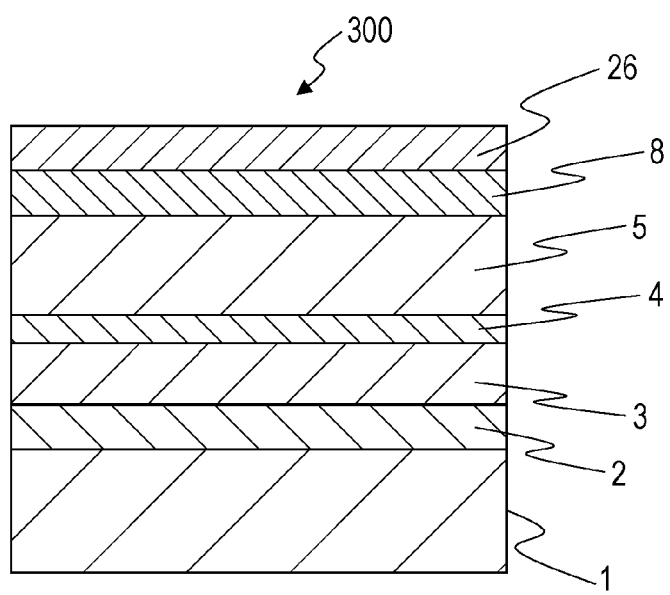
FIG. 3 is a schematic sectional view of a solar cell according to a third embodiment of the present disclosure.

As shown in FIG. 3, the solar cell 300 includes a substrate 1, a first electrode 2, a first hole transport layer 3, an inorganic material layer 4, a light-absorbing layer 5, and a second electrode 26 in addition to the electron transport layer 8. The electron transport layer 8 is located between the light-absorbing layer 5 and the second electrode 26.

Fundamental action effects of the solar cell 300 are described below.

When the solar cell 300 is irradiated with light, the light-absorbing layer 5 absorbs light to generate excited electrons and holes. The excited electrons migrate to the second electrode 26 through the electron transport layer 8. On the other hand, the holes generated in the light-absorbing layer 5 migrate to the first hole transport layer 3 through the inorganic material layer 4. Since the first hole transport layer 3 is connected to the first electrode 2, a current can be drawn from the solar cell 300 in such a manner that the first electrode 2 is used as a positive electrode and the second electrode 26 is used as a negative electrode.

Second Electrode 26

The second electrode 26 is electrically conductive. The second electrode 26 may have substantially the same configuration as that of the second electrode 6. In this embodiment, since the electron transport layer 8 is used, the second electrode 26 need not have the property of blocking holes from a perovskite compound. That is, the second electrode 26 may be made of a material making an ohmic contact with the perovskite compound.

Electron Transport Layer 8

The electron transport layer 8 contains a semiconductor. In the electron transport layer 8, the semiconductor may have a band gap of 3.0 eV or more. Forming the electron transport layer 8 from a substance with a band gap of 3.0 eV or more enables visible light and infrared light to reach the light-absorbing layer 5. An example of the semiconductor is an organic or inorganic n-type semiconductor. Examples of the organic n-type semiconductor include imide compounds, quinone compounds, fullerene, and derivatives thereof. An inorganic semiconductor used may be, for example, an oxide of a metal element or a perovskite oxide. Examples of the metal element oxide include oxides of Cd, Zn, In, Pb, Mo, W, Sb, Bi, Cu, Hg, Ti, Ag, Mn, Fe, V, Sn, Zr, Sr, Ga, and Cr. A particular example of the metal element oxide is $TiO_2$. The perovskite oxide used may be, for example, $SrTiO_3$ or $CaTiO_3$. The electron transport layer 8 may be formed from a substance with a band gap of more than 6 eV. Examples of the substance with a band gap of more than 6 eV include alkali metal halides such as lithium fluoride, alkaline-earth metal halides such as calcium fluoride, alkali metal oxides such as magnesium oxide, and silicon dioxide. In this embodiment, in order to ensure the electron transportability of the electron transport layer 8, the electron transport layer 8 is configured to have a thickness of about 10 nm or less. The electron transport layer 8 may have a multilayer structure including multiple layers made of different materials.

Method for Analyzing Solar Cell

For a solar cell having such a configuration as described in the above embodiments, techniques below are cited as methods for determining elements in layers and the thickness of each layer.

An element can be analyzed in the depth direction of a layer. For example, time-of-flight secondary ion mass spectrometry (TOF-SIMS) is cited as a method for analyzing an element in the depth direction.

The thickness of each layer can be determined in such a manner that, for example, a sample, microfabricated using a focused ion beam (FIB) or the like, having a measurable cross-sectional shape is observed with an electron microscope such as a scanning electron microscope (SEM) or a transmission electron microscope (TEM). Elements in the layer can be determined by elemental analysis by energy dispersive X-ray spectrometry (EDS) performed together with such morphological observation.

Furthermore, in the solar cell, an electron transport layer 8, buffer layer, and second electrode 6 formed on or above a light-absorbing layer 5 can be readily removed from a substrate 1 using an organic solvent such as dimethyl sulfoxide together with the light-absorbing layer 5 because a perovskite compound in the light-absorbing layer 5 is readily dissolved in the organic solvent. Thus, elements in an inorganic material layer 4 can be determined by, for example, X-ray photoelectron spectroscopy (XPS) after a surface of the inorganic material layer 4 is exposed by removing the light-absorbing layer 5 and the layers on or above the light-absorbing layer 5 from the substrate 1. Thereafter, elements in a second hole transport layer 7 and first hole transport layer 3 formed below the inorganic material layer 4 (that is, on the substrate 1 side) can be determined by etching off the inorganic material layer 4 (or the inorganic material layer 4 and the second hole transport layer 7) using, for example, an ion beam.

Particular analysis results obtained by the above-mentioned methods are exemplified below.

Depth-Wise Elemental Analysis by TOF-SIMS

Figure 4A:
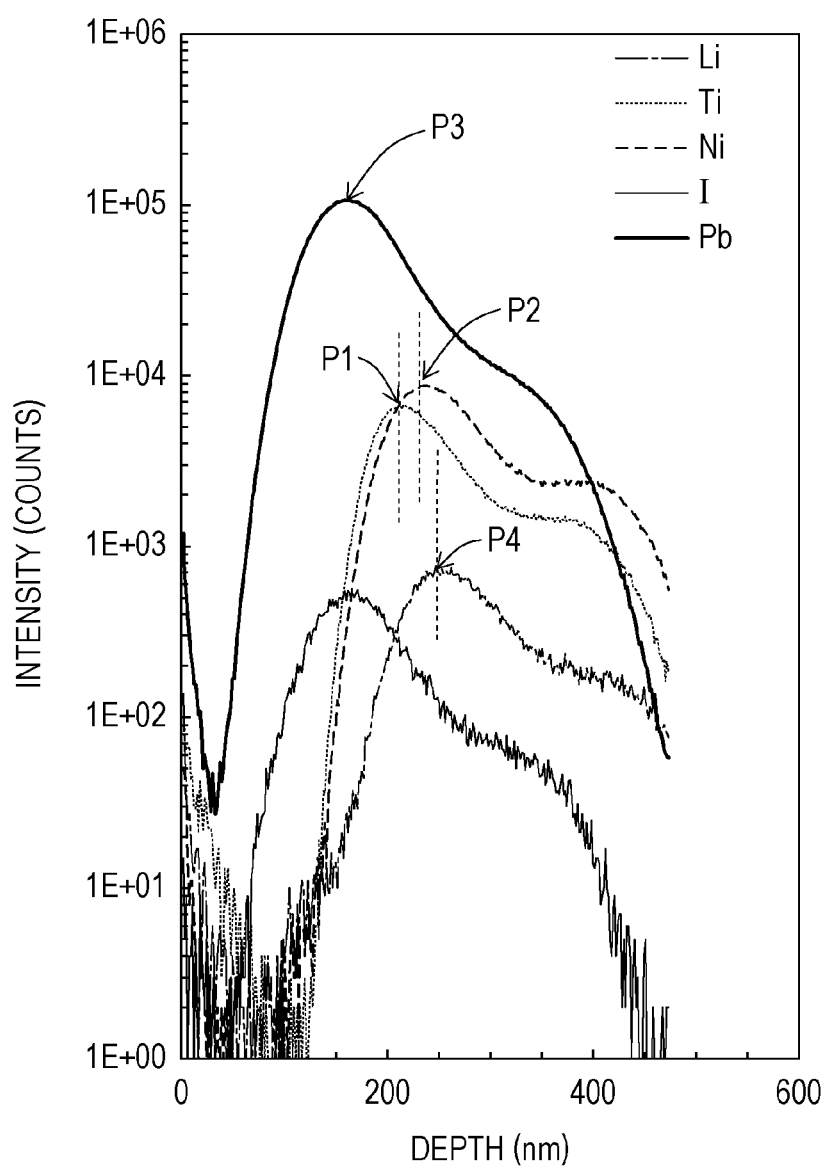
FIG. 4A is a graph showing results obtained by analyzing elements in Solar Cell Sample 1 in the depth direction.
Figure 4B:
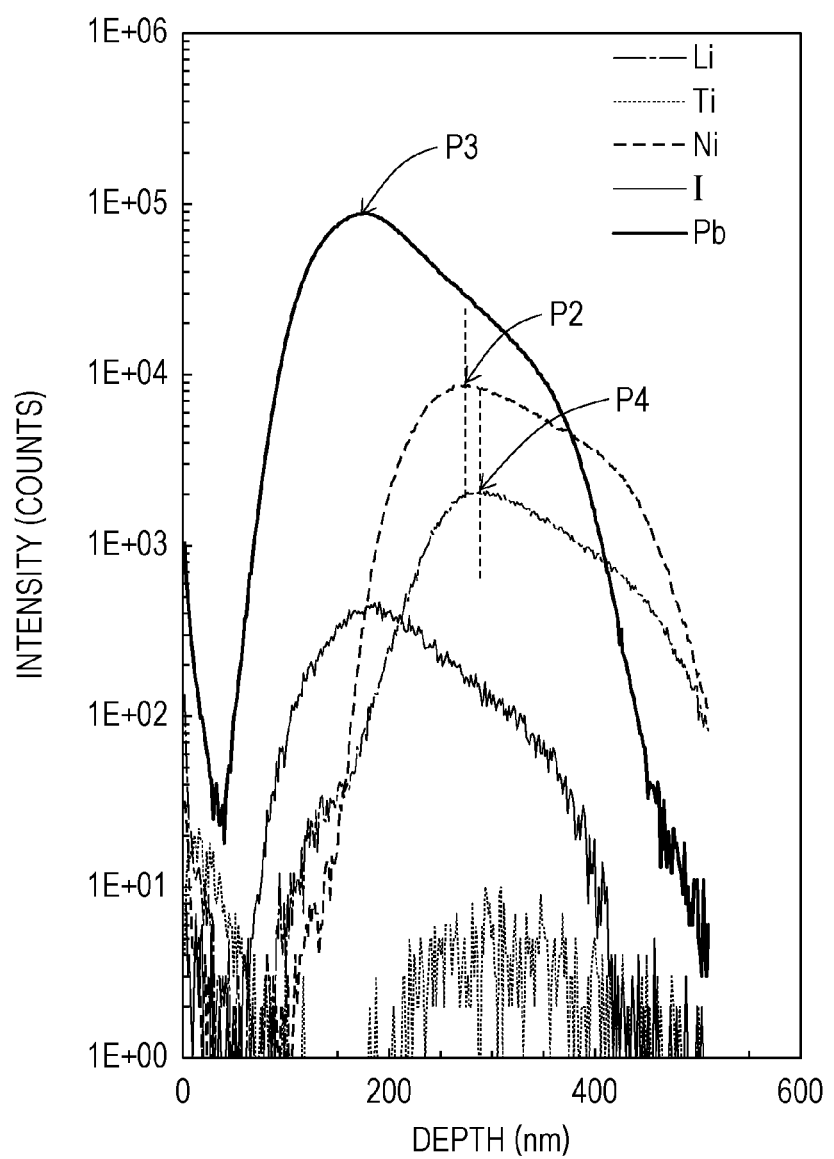
FIG. 4B is a graph showing results obtained by analyzing elements in Solar Cell Sample 2 in the depth direction.
Figure 4C:
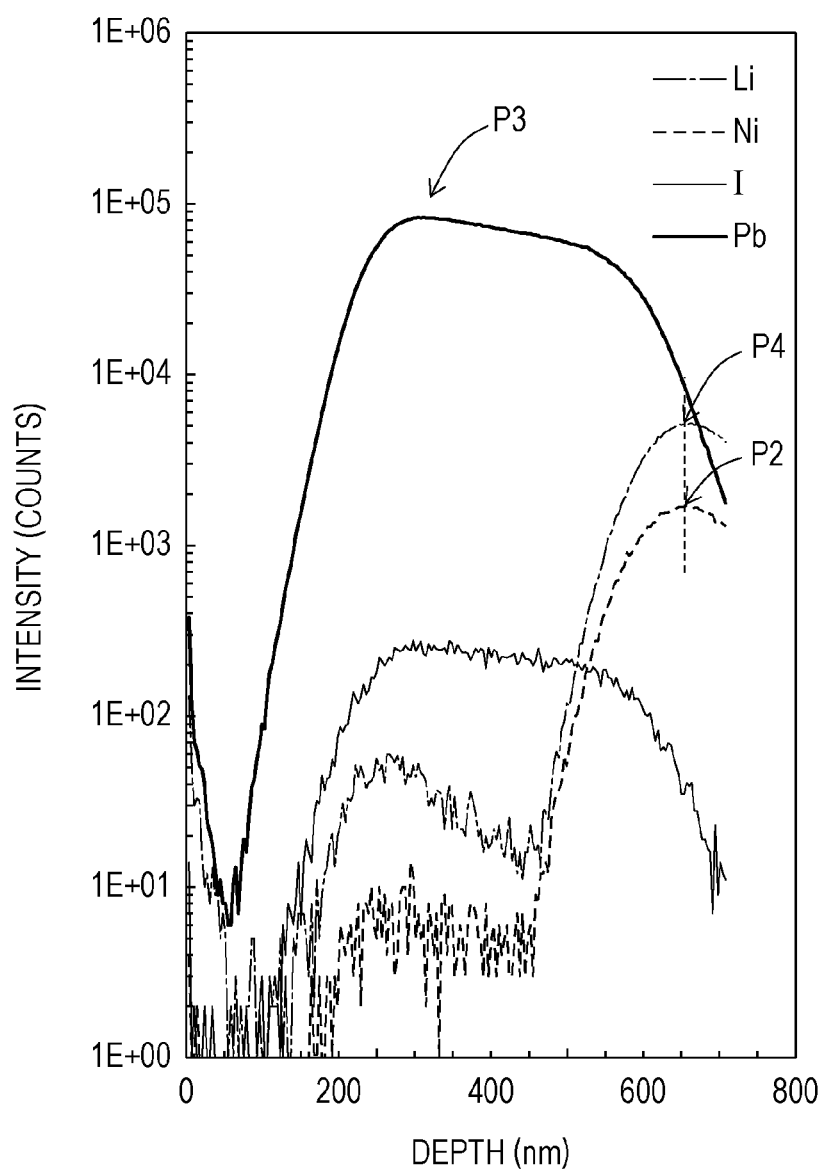
FIG. 4C is a graph showing results obtained by analyzing elements in Solar Cell Sample 3 in the depth direction.

FIGS. 4A to 4C are graphs showing results obtained by analyzing elements in Solar Cell Samples 1 to 3, respectively, in the depth direction by TOF-SIMS. In FIGS. 4A to 4C, the horizontal axis represents the depth from a surface of a second electrode and the vertical axis represents the intensity (the number of ion counts). The configuration of Solar Cell Sample 1 used for analysis is as described below.

Second electrode 6: Al
Light-absorbing layer 5: $CH_3NH_3PbI_3$
Inorganic material layer 4: $TiO_x$
Second hole transport layer 7: Ni—O
First hole transport layer 3: NiLi—O
First electrode 2: ITO Solar Cell Sample 2 has substantially the same configuration as that of Solar Cell Sample 1 except that Solar Cell Sample 2 includes no inorganic material layer 4. Solar Cell Sample 3 has substantially the same configuration as that of Solar Cell Sample 1 except that Solar Cell Sample 3 includes no inorganic material layer 4 or second hole transport layer 7.

As shown in FIG. 4A, Ti is detected in Solar Cell Sample 1, which includes the inorganic material layer 4. Peak P1 corresponding to Ti is located between Peak P2 corresponding to Ni and Peak P3 corresponding to Pb, which is contained in the light-absorbing layer 5. The position of Peak P1 corresponding to Ti is slightly displaced from the position of Peak P2 corresponding to Ni in the depth direction. This shows that there is a difference between the positions (depths) of the two peaks. On the other hand, as shown in FIGS. 4B and 4C, in Solar Cell Samples 2 and 3, which include no inorganic material layer, no peak corresponding to Ti is detected between Peak P2 corresponding to Ni and Peak P3 corresponding to Pb. Thus, it is clear that whether an inorganic material layer containing Ti is present can be confirmed by this analysis method.

As shown in FIG. 4C, in Solar Cell Sample 2, the concentration profiles of Ni and Li have Peaks P2 and P4 at substantially the same depth. However, as shown in FIGS. 4A and 4B, Peak P2 corresponding to Ni is located closer to the light-absorbing layer 5 than Peak P4 corresponding to Li. This shows that, in Solar Cell Samples 1 and 3, the concentration of Li is less on the light-absorbing layer 5 side than on the second electrode 6 side.

Cross-Sectional STEM-EDS Composition Analysis Results

Figure 5A:
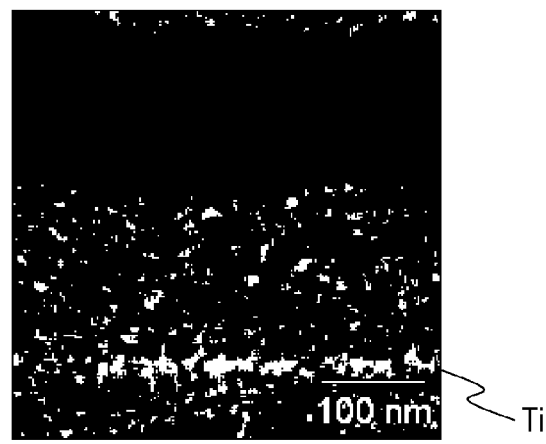
FIG. 5A is a graph showing results obtained by subjecting Solar Cell Sample 1 to EDS composition analysis.
Figure 5B:
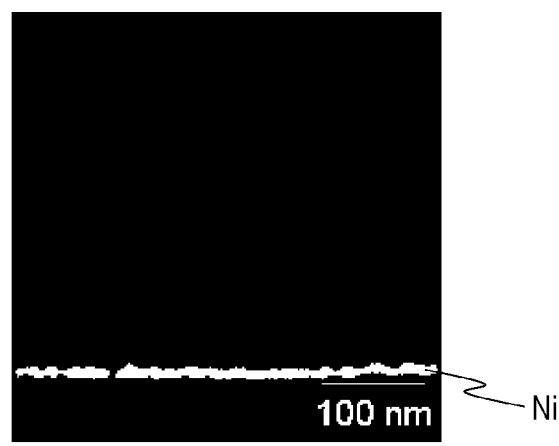
FIG. 5B is a graph showing results obtained by subjecting Solar Cell Sample 1 to EDS composition analysis.
Figure 6A:
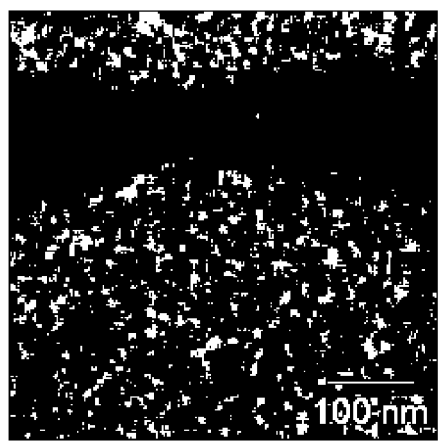
FIG. 6A is a graph showing results obtained by subjecting Solar Cell Sample 2 to EDS composition analysis.
Figure 6B:
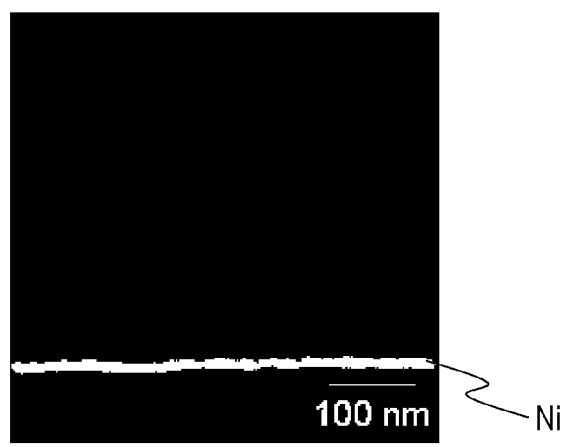
FIG. 6B is a graph showing results obtained by subjecting Solar Cell Sample 2 to EDS composition analysis.

FIGS. 5A and 5B are graphs showing results obtained by subjecting Solar Cell Sample 1 to EDS composition analysis using a scanning transmission electron microscope (STEM) and show analysis results of Ti and Ni, respectively. FIGS. 6A and 6B are graphs showing results obtained by subjecting Solar Cell Sample 2 to EDS composition analysis using the STEM and show analysis results of Ti and Ni, respectively.

As is clear from FIGS. 5A and 5B, in Solar Cell Sample 1, a layer containing Ti is present on a layer in which Ni is detected. As is clear from FIGS. 6A and 6B, in Solar Cell Sample 2, no Ti is detected. Referring to FIGS. 5A and 6A, substantially the whole of a cross section of each sample is sprinkled with white spots, which are noise and do not show the presence of Ti.

EXAMPLES

The present disclosure is described below in detail with reference to examples. Solar cells of Examples 1 to 8 and Comparative Examples 1 to 3 were prepared and were evaluated for characteristics. Elements in layers of the solar cells of Examples 1 to 8 and Comparative Examples 1 to 3 and the thickness of each layer were confirmed by cross-sectional TEM observation, EDS analysis, and XPS analysis.

The configuration of the solar cells of Examples 1 to 8 and Comparative Examples 1 to 3 and a method for preparing each solar cell are described below.

Example 1

The solar cell of Example 1 had substantially the same configuration as that of the solar cell 300 shown in FIG. 3 except that the solar cell of Example 1 included a buffer layer placed between an electron transport layer 8 and a second electrode 26. A material for each component of the solar cell of Example 1 and the thickness of the component were as described below.

Substrate 1: glass and a thickness of 0.7 mm

First electrode 2: fluorine-doped $SnO_2$ (a surface resistivity of 10 Ω/sq.)

First hole transport layer 3: $Ni_{0.9}Li_{0.1}$ and a thickness of 10 nm

Inorganic material layer 4: $TiO_x$ and a thickness of 5 nm

Light-absorbing layer 5: $CH_3NH_3PbI_3$ and a thickness of 300 nm

Electron transport layer 8: PCBM and a thickness of 40 nm

Buffer layer: $Ti_{0.9}Nb_{0.1}O_2$ and a thickness of 10 nm

Second electrode 26: Al and a thickness of 100 nm

A method for preparing the solar cell of Example 1 was as described below.

First, an electrically conductive substrate having a transparent, electrically conductive layer functioning as the first electrode 2 on a surface thereof was prepared. The electrically conductive substrate used was one obtained by uniting the substrate 1 and the first electrode 2. In this example, the electrically conductive substrate used was a 0.7 mm thick electrically conductive glass substrate, available from Nippon Sheet Glass Co., Ltd., having a fluorine-doped $SnO_2$ layer on a surface thereof.

Next, a $Ni_{0.9}Li_{0.1}O$ layer which was the first hole transport layer 3 and which had a thickness of about 10 nm was formed on the fluorine-doped $SnO_2$ layer, which was the first electrode 2. The $Ni_{0.9}Li_{0.1}O$ layer was formed by a spraying process using an aqueous solution that was prepared in such a manner that a 0.1 mol/L aqueous solution of nickel nitrate hexahydrate and a 0.1 mol/L aqueous solution of lithium nitrate were mixed so as to give a desired film composition. The temperature of the substrate 1 during spraying was 500° C.

Subsequently, a $TiO_x$ layer which was the inorganic material layer 4 and which had a thickness of about 5 nm was formed on the $Ni_{0.9}Li_{0.1}O$ layer, which was the first hole transport layer 3. The $TiO_x$ layer was formed in such a manner that a 20 mmol/L aqueous solution of $TiCl_4$ was applied to a surface of the $Ni_{0.9}Li_{0.1}O$ layer, followed by heat treatment at 70° C. for 30 minutes.

Next, a $CH_3NH_3PbI_3$ layer which was the light-absorbing layer 5 was formed on the $TiO_x$ layer, which was the inorganic material layer 4. In particular, a dimethyl sulfoxide (DMSO) solution containing $PbI_2$ at a concentration of 1 mol/L and methylammonium iodide ($CH_3NH_3I$) at a concentration of 1 mol/L was prepared. Next, the DMSO solution was applied to the substrate 1 provided with the $TiO_x$ layer by a spin coating process. Thereafter, the substrate 1 was heat-treated at 100° C. on a hotplate, whereby the light-absorbing layer 5 was obtained. Incidentally, the number of revolutions of a spin coater was set such that the light-absorbing layer 5 had a thickness of about 300 nm. In order to promote the crystallization of the light-absorbing layer 5 during heat treatment, toluene was dripped onto the rotating substrate 1 after about 25 seconds from the start of spin coating.

Subsequently, a [6,6]-phenyl-C61-butyric acid methyl ester (PCBM) layer which was the electron transport layer 8 and which had a thickness of about 40 nm was formed on the $CH_3NH_3PbI_3$ layer, which was the light-absorbing layer 5. The PCBM layer was formed by a spin coating process using a 50 mmol/L chlorobenzene solution of PCBM.

Next, a $Ti_{0.9}Nb_{0.1}O_2$ layer which was the buffer layer and which had a thickness of about 10 nm was formed on the PCBM layer, which was the electron transport layer 8. The $Ti_{0.9}Nb_{0.1}O_2$ layer was obtained in such a manner that the following solution was applied to the PCBM layer by a spin coating process, followed by hydrolyzing the applied solution: a solution that was prepared in such a manner that a 5 μmol/L methanol solution of titanium isopropoxide and a 5 μmol/L methanol solution of niobium ethoxide were mixed so as to give a desired film composition.

The preparation of the solutions used to form the light-absorbing layer 5, the electron transport layer 8, and the buffer layer and processes such as spin coating and heat treatment were all performed in a nitrogen atmosphere in a glove box.

Finally, an Al layer which was the second electrode 26 and which had a thickness of about 100 nm was formed on the $Ti_{0.9}Nb_{0.1}O_2$ layer, which was the buffer layer, by resistive heating evaporation. In this way, the solar cell of Example 1 was obtained.

Example 2

The following solar cell was prepared: a solar cell having substantially the same configuration as that of the solar cell 200 shown in FIG. 2 except that an electron transport layer 8 and a buffer layer were placed between a light-absorbing layer 5 and a second electrode 26 in that order. A material for each component of the solar cell of Example 2 and the thickness of the component were as described below.

Substrate 1: glass and a thickness of 0.7 mm

First electrode 2: fluorine-doped $SnO_2$ (a surface resistivity of 10 Ω/sq.)

First hole transport layer 3: $Ni_{0.9}Li_{0.1}O$ and a thickness of 10 nm

Second hole transport layer 7: NiO and a thickness of 5 nm

Inorganic material layer 4: $TiO_x$ and a thickness of 5 nm

Light-absorbing layer 5: $CH_3NH_3PbI_3$ and a thickness of 300 nm

Electron transport layer 8: PCBM and a thickness of 40 nm

Buffer layer: $Ti_{0.9}Nb_{0.1}O_2$ and a thickness of 10 nm

Second electrode 26: Al and a thickness of 100 nm

A method for preparing the solar cell of Example 2 was as described below.

First, the first hole transport layer 3 was formed above an electrically conductive substrate having the first electrode 2 on a surface thereof in the same manner as that used in Example 1.

Next, a NiO layer which was the second hole transport layer 7 and which had a thickness of about 5 nm was formed on a $Ni_{0.9}Li_{0.1}O$ layer which was the first hole transport layer 3. In this example, the NiO layer was in such a manner that a 0.3 mol/L 2-methoxyethanol solution of nickel acetate tetrahydrate was applied to the $Ni_{0.9}Li_{0.1}O$ layer by a spin coating process, followed by firing the applied solution at a temperature of 550° C. in air.

Subsequently, the inorganic material layer 4, the light-absorbing layer 5, the electron transport layer 8, the buffer layer, and the second electrode 26 were formed on the NiO layer, which was the second hole transport layer 7, in the same manner as that used in Example 1, whereby the solar cell of Example 2 was obtained.

Example 3

The solar cell of Example 3 was prepared by substantially the same method as that used in Example 1 except that a formed first hole transport layer 3 was a NiO layer with a thickness of about 10 nm. The NiO layer was formed by a spraying process using a 0.1 mol/L aqueous solution of nickel nitrate hexahydrate. Components other than the first hole transport layer 3 were the same as those formed in Example 1.

Example 4

The solar cell of Example 4 was prepared by substantially the same method as that used in Example 1 except that a formed first hole transport layer 3 was a $Ni_{0.8}Mg_{0.2}O$ layer with a thickness of about 10 nm. The $Ni_{0.8}Mg_{0.2}O$ layer was formed by a spraying process using an aqueous solution that was prepared in such a manner that a 0.1 mol/L aqueous solution of nickel nitrate hexahydrate and a 0.1 mol/L aqueous solution of magnesium nitrate hexahydrate were mixed so as to give a desired film composition. Components other than the first hole transport layer 3 were the same as those formed in Example 1.

Example 5

The solar cell of Example 5 was prepared by substantially the same method as that used in Example 1 except that a formed first hole transport layer 3 was a $Ni_{0.7}Li_{0.1}Mg_{0.2}O$ layer with a thickness of about 10 nm. The $Ni_{0.7}Li_{0.1}Mg_{0.2}O$ layer was formed by a spraying process using an aqueous solution that was prepared in such a manner that a 0.1 mol/L aqueous solution of nickel nitrate hexahydrate, lithium nitrate, and an aqueous solution of magnesium nitrate hexahydrate were mixed so as to give a desired film composition. Components other than the first hole transport layer 3 were the same as those formed in Example 1.

Example 6

The solar cell of Example 6 was prepared by substantially the same method as that used in Example 1 except that a formed inorganic material layer 4 was a $TiO_x$ layer with a thickness of about 3 nm. Components other than the inorganic material layer 4 were the same as those formed in Example 1.

Example 7

The solar cell of Example 7 was prepared by substantially the same method as that used in Example 1 except that a formed inorganic material layer 4 was a $TiO_x$ layer with a thickness of about 3 nm. Components other than the inorganic material layer 4 were the same as those formed in Example 1.

Example 8

The solar cell of Example 8 was prepared by substantially the same method as that used in Example 2 except that a formed first hole transport layer 3 was a $Ni_{0.8}Li_{0.2}O$ layer with a thickness of about 10 nm and a formed second hole transport layer 7 was a $Ni_{0.75}Li_{0.05}Mg_{0.20}O$ layer with a thickness of about 5 nm. The $Ni_{0.8}Li_{0.2}O$ layer, which was the first hole transport layer 3, was formed by a spraying process using an aqueous solution that was prepared in such a manner that a 0.1 mol/L aqueous solution of nickel nitrate hexahydrate and a 0.1 mol/L aqueous solution of lithium nitrate were mixed so as to give a desired film composition. The $Ni_{0.75}Li_{0.05}Mg_{0.20}O$ layer, which was the second hole transport layer 7, was formed by a spraying process in such a manner that the following solution was applied by a spin coating process, followed by firing at 550° C. in air: a solution that was prepared in such a manner that a 0.3 mol/L 2-methoxyethanol solution of nickel acetate tetrahydrate, a 0.3 mol/L 2-methoxyethanol solution of lithium acetate dihydrate, and a 0.3 mol/L 2-methoxyethanol solution of magnesium acetate tetrahydrate were mixed so as to give a desired film composition. Components other than the first hole transport layer 3 and the second hole transport layer 7 were the same as those formed in Example 2.

Comparative Example 1

The solar cell of Comparative Example 1 had substantially the same configuration as that of the solar cell of Example 1 except that the solar cell of Comparative Example 1 included no inorganic material layer 4. A material for each component of the solar cell of Comparative Example 1 and the thickness of the component were as described below.

Substrate 1: glass and a thickness of 0.7 mm

First electrode 2: fluorine-doped $SnO_2$ (a surface resistivity of 10 Ω/sq.)

First hole transport layer 3: $Ni_{0.9}Li_{0.1}O$ and a thickness of 10 nm

Light-absorbing layer 5: $CH_3NH_3PbI_3$ and a thickness of 300 nm

Electron transport layer 8: PCBM and a thickness of 40 nm

Buffer layer: $Ti_{0.9}Nb_{0.1}O_2$ and a thickness of 10 nm

Second electrode 26: Al and a thickness of 100 nm

A method for preparing the solar cell of Comparative Example 1 was as described below.

First, the first hole transport layer 3 was formed above an electrically conductive substrate having the first electrode 2 on a surface thereof in the same manner as that used in Example 1.

Next, a $CH_3NH_3PbI_3$ layer which was the light-absorbing layer 5 and which had a thickness of about 300 nm was formed on a $Ni_{0.9}Li_{0.1}O$ layer which was the first hole transport layer 3 in the same manner as that used in Example 1. Thereafter, the electron transport layer 8, the buffer layer, and the second electrode 26 were formed in the same manner as that used in Example 1, whereby the solar cell of Comparative Example 1 was obtained.

Comparative Example 2

The solar cell of Comparative Example 2 was prepared by substantially the same method as that used in Comparative Example 1 except that a formed first hole transport layer 3 was a $Ni_{0.8}Li_{0.2}O$ layer with a thickness of about 10 nm. Components other than the first hole transport layer 3 were the same as those formed in Comparative Example 1.

Comparative Example 3

The solar cell of Comparative Example 3 was prepared by substantially the same method as that used in Comparative Example 1 except that a formed first hole transport layer 3 was a $Ni_{0.8}Li_{0.1}Mg_{0.1}O$ layer with a thickness of about 10 nm. Components other than the first hole transport layer 3 were the same as those formed in Comparative Example 1.

Evaluation of Solar Cells

The solar cells of Examples 1 to 8 and Comparative Examples 1 to 3 were irradiated with light with an irradiance of 100 mW/cm$^2$ using a solar simulator and were measured for current-voltage characteristic. Furthermore, the open-circuit voltage (V), short-circuit current density (mA/cm$^2$), fill factor, and conversion efficiency (%) of each solar cell were determined from the current-voltage characteristic thereof after stabilization.

Figure 7:
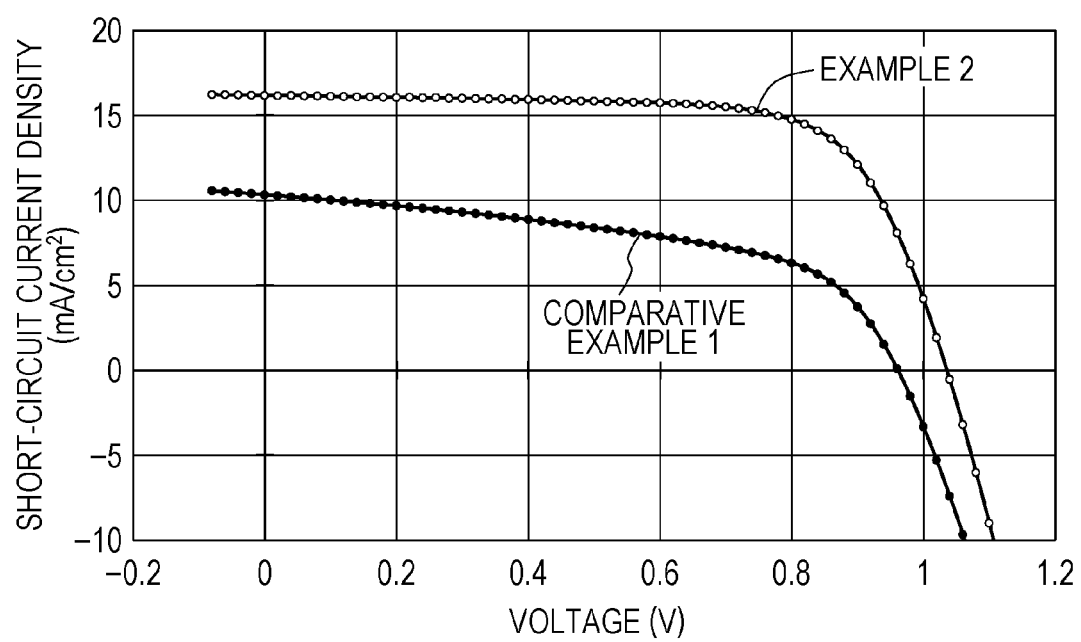
FIG. 7 is a graph showing the current-voltage characteristic of each of solar cells of Example 2 and Comparative Example 1.

Evaluation results are shown in the table. Furthermore, measurement results of the current-voltage characteristic of the solar cells of Example 2 and Comparative Example 1 are shown in FIG. 7.

From the above results, it is clear that placing an inorganic material layer containing titanium between a first hole transport layer and a light-absorbing layer allows a solar cell having an inverted stack structure including a hole transport layer containing nickel to have increased photoelectric conversion efficiency. It is confirmed that when the first hole transport layer contains Li and/or Mg, the photoelectric conversion efficiency can be further increased. Furthermore, it is confirmed that placing a second hole transport layer in which the proportion of Li is less than that in the first hole transport layer between the first hole transport layer and the inorganic material layer enables the photoelectric conversion efficiency to be further increased.

Fourth Embodiment

A solar cell module 400 according to a fourth embodiment of the present disclosure is an integrated solar cell module including unit cells 30, having the same configuration as that of the solar cell 300 according to the third embodiment, connected in series.

Figure 8:
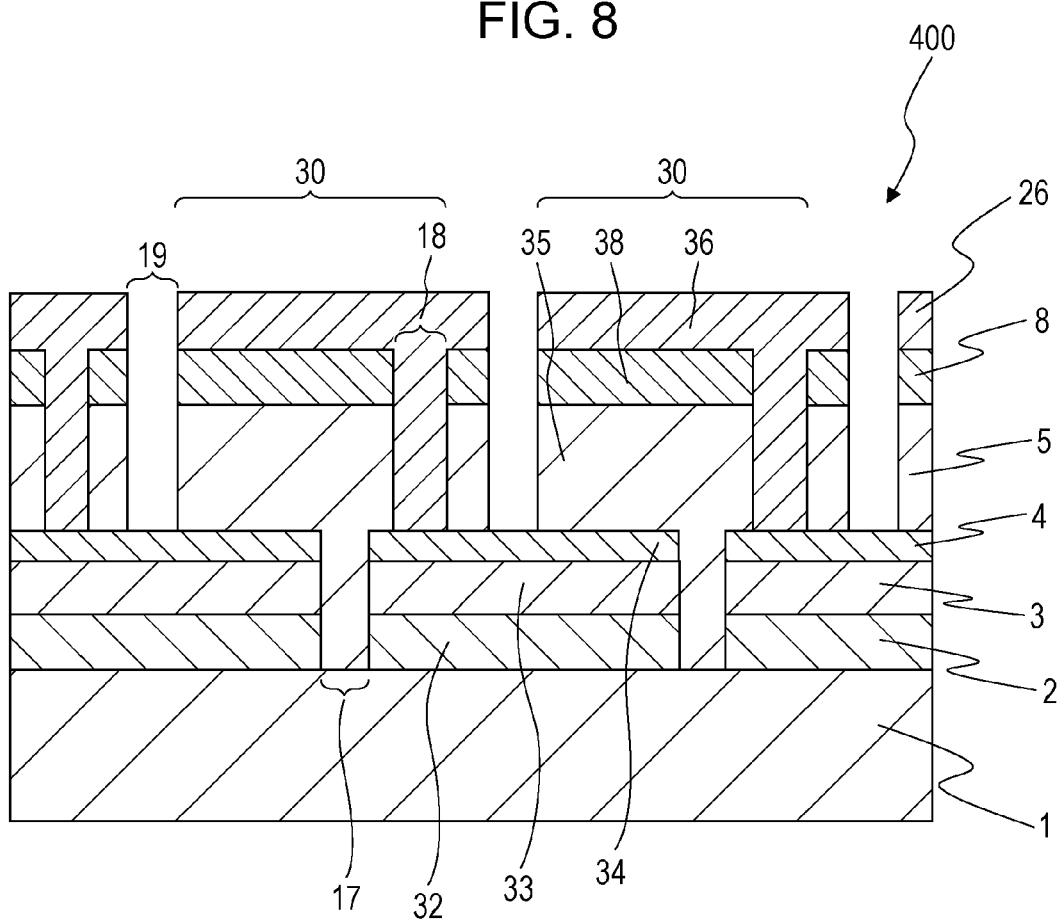
FIG. 8 is a schematic sectional view of a solar cell module according to a fourth embodiment of the present disclosure.

As shown in FIG. 8, the solar cell module 400 includes a substrate 1, a first electrode 2, a first hole transport layer 3, an inorganic material layer 4, a light-absorbing layer 5, an electron transport layer 8, and a second electrode 26.

The first electrode 2, the first hole transport layer 3, and the inorganic material layer 4 are divided into a plurality of first electrodes 32, first hole transport layers 33, and inorganic material layers 34, respectively, by a first division trench 17. The light-absorbing layer 5 and the electron transport layer 8 are divided into a plurality of light-absorbing layers 35 and electron transport layers 38, respectively, by a second division trench 18. The second electrode 26 is divided into a plurality of second electrode 36 by a third division trench 19. The third division trench 19 may extend in the light-absorbing layer 5 and the electron transport layer 8. The first division trench 17, the second division trench 18, and the third division trench 19 may extend in, for example, a striped pattern. These trenches may be arranged in substantial parallel to each other.

TABLE

| | Thickness of inorganic material layer | Composition of first hole transport layer | Composition of second hole transport layer | Short-circuit current density (mA/cm$^2$) | Open-circuit voltage (V) | Fill factor | Conversion efficiency (%) |
|---|---|---|---|---|---|---|---|
| Example 1 | 5 nm | $Ni_{0.9}Li_{0.1}O$ | — | 15.8 | 1.00 | 0.63 | 10.0 |
| Example 2 | 5 nm | $Ni_{0.9}Li_{0.1}O$ | NiO | 16.2 | 1.04 | 0.71 | 11.9 |
| Example 3 | 5 nm | NiO | — | 15.5 | 1.02 | 0.54 | 8.5 |
| Example 4 | 5 nm | $Ni_{0.8}Mg_{0.2}O$ | — | 15.3 | 1.04 | 0.52 | 8.3 |
| Example 5 | 5 nm | $Ni_{0.7}Li_{0.1}Mg_{0.2}O$ | — | 15.6 | 1.02 | 0.62 | 9.9 |
| Example 6 | 3 nm | $Ni_{0.9}Li_{0.1}O$ | — | 15.0 | 1.01 | 0.65 | 9.8 |
| Example 7 | 10 nm | $Ni_{0.9}Li_{0.1}O$ | — | 15.4 | 0.99 | 0.60 | 9.1 |
| Example 8 | 5 nm | $Ni_{0.8}Li_{0.2}O$ | $Ni_{0.75}Li_{0.05}Mg_{0.2}O$ | 16.1 | 1.03 | 0.70 | 11.6 |
| Comparative Example 1 | — | $Ni_{0.9}Li_{0.1}O$ | — | 10.3 | 0.96 | 0.52 | 5.1 |
| Comparative Example 2 | — | $Ni_{0.8}Li_{0.2}O$ | — | 10.1 | 0.95 | 0.54 | 5.2 |
| Comparative Example 3 | — | $Ni_{0.8}Li_{0.1}Mg_{0.1}O$ | — | 10.4 | 0.98 | 0.51 | 5.2 |

As is clear from the table, the solar cells of Examples 1 to 8 that included the inorganic material layers 4 exhibited good results, that is, a short-circuit current density of greater than 15 mA/cm$^2$ and a conversion efficiency of greater than 8%. However, the solar cells of Comparative Examples 1 to 3 that included no inorganic material layer 4 exhibited a short-circuit current density and conversion efficiency lower than those of the solar cells of Examples 1 to 8.

Each of the unit cells 30 has a multilayer structure in which a corresponding one of the first electrodes 32, a corresponding one of the first hole transport layers 33, a corresponding one of the inorganic material layers 34, a corresponding one of the light-absorbing layers 35, a corresponding one of the electron transport layers 38, and a corresponding one of the second electrodes 36 are stacked in that order. The second division trench 18 is placed so as to overlap the first electrodes 32, the first hole transport layers 33, and the inorganic material layers 34 as viewed in a direction normal to the substrate 1. The second electrodes 36 of the neighboring unit cells 30 extend in the second division trench 18. In the second division trench 18, the first electrodes 32 are electrically connected to the second electrodes 36 of the neighboring unit cells 30. That is, the second division trench 18 functions as a trench for cell connection.

The unit cells 30 are independent solar cells that include the first hole transport layers 33, the inorganic material layers 34, the light-absorbing layers 35, and the electron transport layers 38, which form junctions, and that include the first electrodes 32 and the second electrodes 36, which are output terminals. The first electrode 32 of one of the unit cells 30 is electrically connected to the second electrode 36 of one of the neighboring unit cells 30 on both sides. The second electrode 36 of one of the unit cells 30 is electrically connected to the first electrode 32 of another one of the neighboring unit cells 30. In this way, the unit cells 30 are connected in series. In the solar cell module 400, which includes the unit cells 30, the light-absorbing layers 35, which are placed on the inorganic material layers 34, are in contact with the first electrodes 32 and the first hole transport layers 33, which are located under the inorganic material layers 34, in the first division trench 17.

In the solar cell module 400, a connection connecting the first electrodes 32 to the second electrodes 36 may be placed on the bottom of the second division trench 18.

Figure 9:
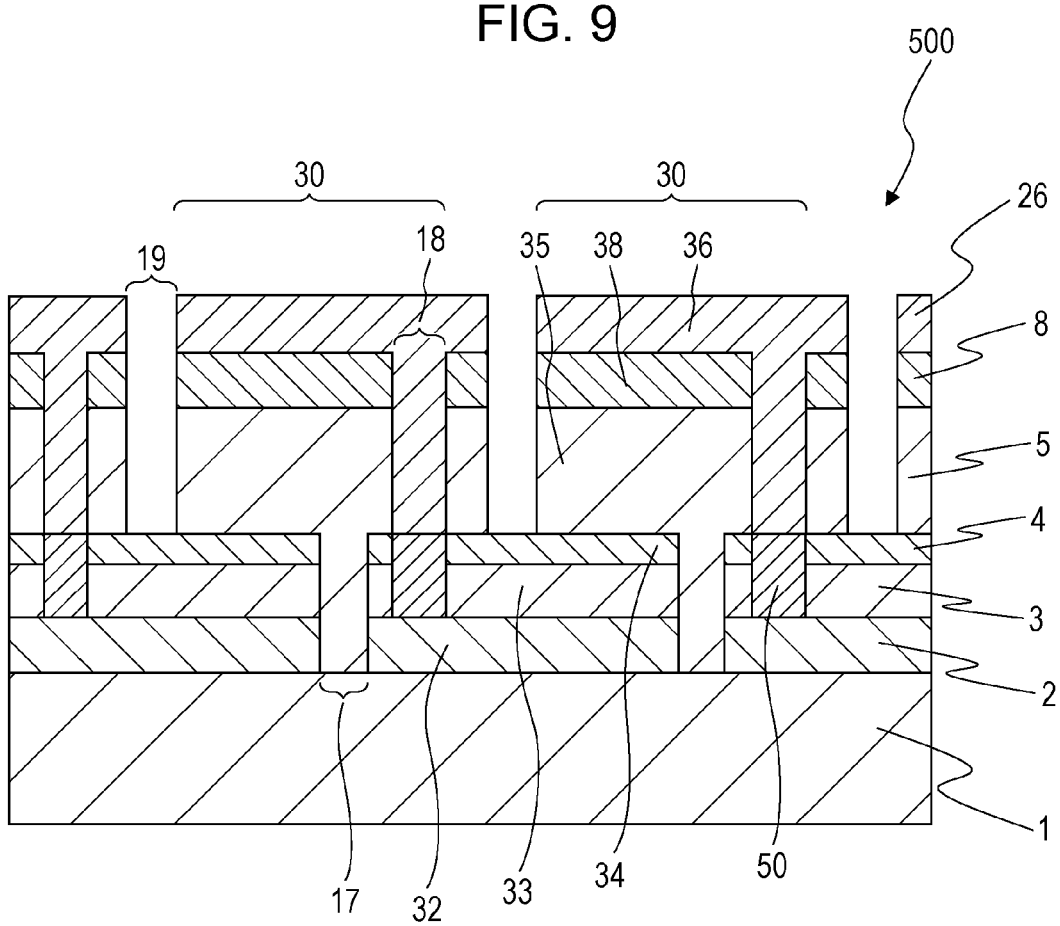
FIG. 9 is a schematic sectional view of a modification of the solar cell module according to the fourth embodiment.

A solar cell module 500 shown in FIG. 9 is different from the solar cell module 400, which is shown in FIG. 8, in that the solar cell module 500 includes connections 50. The connections 50 are portions which are located on the bottom of a second division trench 18 and which are interposed between first electrodes 32 and light-absorbing layers 35. That is, the connections 50 are portions of inorganic material layers 34 and first hole transport layers 33 that overlap the second division trench 18 in plan view. The connections 50, for example, include a mixture of inorganic material layers 34, first hole transport layers 33 and first electrodes 32.

The connections 50 have lower resistance due to the incorporation of impurity metal atoms as compared to other portions. Thus, the effect of reducing the resistance between unit cells 30 is obtained. In the solar cell module 500, the light-absorbing layers 35 are in contact with the first electrodes 32 and the first hole transport layers 33 in a first division trench 17.

In this embodiment, the integrated solar cell module including the unit cells 30, which have the same configuration as that of the solar cell 300 according to the third embodiment, has been exemplified. However, the unit cells 30 may have the same configuration as that of the solar cell 100 or 200 according to the first or second embodiment. When the unit cells 30 have, for example, the same configuration as that of the solar cell 200 according to the second embodiment, the light-absorbing layers 35 may be in contact with the first electrodes 32, the first hole transport layers 33, and second hole transport layers which are located under the inorganic material layers 34 in the first division trench 17.

A solar cell according to the present disclosure is useful as, for example, a solar battery placed on a roof and is also useful as a photodetector. The solar cell can be used for image sensing.

What is claimed is:

1. A solar cell comprising:
   a first electrode;
   a first hole transport layer containing nickel and lithium;
   an inorganic material layer containing titanium;
   a light-absorbing layer converting light into electric charge;
   a second hole transport layer, located between the first hole transport layer and the inorganic material layer, containing nickel and lithium; and
   a second electrode, wherein
   the first electrode, the first hole transport layer, the inorganic material layer, the light-absorbing layer, and the second electrode are layered in that order,
   the light-absorbing layer contains a perovskite compound represented by a formula $AMX_3$, where A is a monovalent cation, M is a divalent cation, and X is a monovalent anion, and
   an atomic ratio of lithium to all metal elements in the second hole transport layer is less than an atomic ratio of lithium to all metal elements in the first hole transport layer.

2. The solar cell according to claim 1, wherein the first hole transport layer further contains magnesium.

3. The solar cell according to claim 1, wherein an atomic ratio of lithium to all the metal elements in the first hole transport layer is 1% or more and 30% or less.

4. The solar cell according to claim 1, wherein a thickness of the inorganic material layer is less than a thickness of the first hole transport layer.

5. The solar cell according to claim 1, wherein the inorganic material layer has a thickness of 1 nm or more and 20 nm or less.

6. A solar cell module comprising:
   a substrate; and
   first and second unit cells that are located on the substrate and that are connected in series to each other, each of the first and second unit cells including:
   a first electrode;
   a first hole transport layer containing nickel and lithium;
   an inorganic material layer containing titanium;
   a light-absorbing layer converting light into electric charge;
   a second hole transport layer, located between the first hole transport layer and the inorganic material layer, containing nickel and lithium; and
   a second electrode, wherein
   the first electrode, the first hole transport layer, the inorganic material layer, the light-absorbing layer, and the second electrode are layered on the substrate in that order,
   the light-absorbing layer contains a perovskite compound represented by a formula $AMX_3$, where A is a monovalent cation, M is a divalent cation, and X is a monovalent anion,
   the first electrode, the first hole transport layer, and the inorganic material layer of the first unit cell are separated from the first electrode, the first hole transport layer, and the inorganic material layer of the second unit cell by a trench,
   the light-absorbing layer of the first unit cell is in contact with the first hole transport layer of the first unit cell and the first hole transport layer of the second unit cell in the trench, and
   an atomic ratio of lithium to all metal elements in the second hole transport layer is less than an atomic ratio of lithium to all metal elements in the first hole transport layer.

7. The solar cell module according to claim 6, wherein the first hole transport layer further contains magnesium.

8. The solar cell module according to claim 6, wherein an atomic ratio of lithium to all the metal elements in the first hole transport layer is 1% or more and 30% or less.

9. The solar cell module according to claim 6, wherein a thickness of the inorganic material layer is less than a thickness of the first hole transport layer.

10. The solar cell module according to claim 6, wherein the inorganic material layer has a thickness of 1 nm or more and 20 nm or less.

11. A solar cell comprising:
a first electrode;
a first hole transport layer containing nickel and lithium;
an inorganic material layer containing titanium;
a light-absorbing layer converting light into electric charge;
a second hole transport layer, located between the first hole transport layer and the inorganic material layer, containing nickel and substantially no lithium; and
a second electrode,
wherein
the first electrode, the first hole transport layer, the inorganic material layer, the light-absorbing layer, and the second electrode are layered in that order, and
the light-absorbing layer contains a perovskite compound represented by a formula $AMX_3$, where A is a monovalent cation, M is a divalent cation, and X is a monovalent anion.

12. The solar cell according to claim 11, wherein the first hole transport layer further contains magnesium.

13. The solar cell according to claim 11, wherein an atomic ratio of lithium to all the metal elements in the first hole transport layer is 1% or more and 30% or less.

14. The solar cell according to claim 11, wherein a thickness of the inorganic material layer is less than a thickness of the first hole transport layer.

15. The solar cell according to claim 11, wherein the inorganic material layer has a thickness of 1 nm or more and 20 nm or less.

16. A solar cell module comprising:
a substrate; and
first and second unit cells that are located on the substrate and that are connected in series to each other, each of the first and second unit cells including:
a first electrode;
a first hole transport layer containing nickel and lithium;
an inorganic material layer containing titanium;
a light-absorbing layer converting light into electric charge;
a second hole transport layer, located between the first hole transport layer and the inorganic material layer, containing nickel and substantially no lithium; and
a second electrode, wherein
the first electrode, the first hole transport layer, the inorganic material layer, the light-absorbing layer, and the second electrode are layered on the substrate in that order;
the light-absorbing layer contains a perovskite compound represented by a formula $AMX_3$, where A is a monovalent cation, M is a divalent cation, and X is a monovalent anion;
the first electrode, the first hole transport layer, and the inorganic material layer of the first unit cell are separated from the first electrode, the first hole transport layer, and the inorganic material layer of the second unit cell by a trench; and
the light-absorbing layer of the first unit cell is in contact with the first hole transport layer of the first unit cell and the first hole transport layer of the second unit cell in the trench.

17. The solar cell according to claim 16, wherein the first hole transport layer further contains magnesium.

18. The solar cell according to claim 16, wherein an atomic ratio of lithium to all the metal elements in the first hole transport layer is 1% or more and 30% or less.

19. The solar cell according to claim 16, wherein a thickness of the inorganic material layer is less than a thickness of the first hole transport layer.

20. The solar cell according to claim 16, wherein the inorganic material layer has a thickness of 1 nm or more and 20 nm or less.

* * * * *